United States Patent
Podlesny et al.

(10) Patent No.: US 6,265,896 B1
(45) Date of Patent: Jul. 24, 2001

(54) LEVEL TRANSFER CIRCUIT FOR LVCMOS APPLICATIONS

(75) Inventors: Andrew V. Podlesny; Gountis V. Kristovski, both of Moscow (RU)

(73) Assignee: Elbrus International Limited (KY)

( * ) Notice: Subject to any disclaimer, the term of this patent is extended or adjusted under 35 U.S.C. 154(b) by 0 days.

(21) Appl. No.: 09/514,438

(22) Filed: Feb. 16, 2000

Related U.S. Application Data

(60) Provisional application No. 60/120,359, filed on Feb. 17, 1999.

(51) Int. Cl.[7] .................... H03K 19/0175; H03L 5/00
(52) U.S. Cl. ........................ 326/80; 326/81; 326/68; 327/333
(58) Field of Search .................. 326/60, 62, 68, 326/80, 81; 327/333

(56) References Cited

U.S. PATENT DOCUMENTS

| | | |
|---|---|---|
| 5,315,157 | 5/1994 | Koizumi . |
| 5,321,324 * | 6/1994 | Hardee et al. ............... 307/475 |
| 5,422,523 * | 6/1995 | Roberts et al. ............... 326/68 |
| 5,434,519 | 7/1995 | Trinh et al. . |
| 5,635,859 | 6/1997 | Yokota et al. . |
| 5,650,742 * | 7/1997 | Hirano ....................... 327/333 |
| 5,864,251 | 1/1999 | Bloker et al. . |
| 5,994,944 | 11/1999 | Manyoki . |
| 6,005,432 * | 12/1999 | Guo et al. ................... 327/333 |
| 6,137,312 * | 10/2000 | Manning ..................... 326/81 |

OTHER PUBLICATIONS

Lance A. Glasser and Daniel W. Dobberpuhl, *The Design and Analysis of VLSI Circuits*, Addison–Wesley Publishing Company 1985, pp. 294–295.

Mutoh, et al., A 1V Multi–Threshold Voltage CMOS DSP with an Efficient Power Management Technique for Mobile Phone Applications, ISSCC Digest of Technical Papers, pp. 168–169, Feb. 1996.

Date, et al., 1–V, 30–MHz Memory–Macrocell–Circuit Technology with a 0.5 μm Multi–threshold CMOS, IEEE Symposium on Low Power Electronics, pp. 90–91, 1994.

Takashima, et al., Standby/Active Mode Logic for Sub–1–V Operating ULSI Memory, IEEE Journal of Solid–State Circuits, vol. 29, No. 4, pp. 441–447, Apr. 1994.

Keith Diefendorff, Microprocessor Report, The Insiders' Guide to Microprocessor Hardware, The Russians Are Coming, Supercomputer Maker Elbrus Seeks to Join x86/IA–64 Melee, Feb. 15, 1999, vol. 13, No. 2, pp. 1–7.

* cited by examiner

*Primary Examiner*—Michael Tokar
*Assistant Examiner*—Vibol Tan
(74) *Attorney, Agent, or Firm*—Townsend and Townsend and Crew

(57) ABSTRACT

A fully static level translation circuit having a standby power close to zero. The level translation circuit for translating the voltage level of an input signal having a first voltage level to form an output signal having a second voltage level. The translation circuit comprises an input stage having logic to receive the input signal having the first voltage level and to create a first stage output signal, an output stage having logic to receive the first stage output signal and produce the output signal having the second voltage level, and a reset stage having logic to receive the first stage output signal and the output signal and to produce a reset stage output signal that is coupled to the output stage.

4 Claims, 2 Drawing Sheets

LEVEL TRANSFER CIRCUIT FOR LVCMOS APPLICATIONS

CROSS-REFERENCES TO RELATED APPLICATIONS

This application claims priority from co-pending U.S. Provisional Patent Application 60/120,359 filed on Feb. 17, 1999, the disclosure of which is incorporated herein in its entirety for all purposes.

FIELD OF THE INVENTION

This invention is related to level translation circuitry, and in particular, to a level translation circuit for use with low voltage CMOS circuitry.

BACKGROUND OF THE INVENTION

There are a number of situations when it is desirable to translate signals with small voltage swings into signals with larger voltage swings. For a differential input signal, the typical solution uses a sense amplifier (SA). In order to use the SA in the case of non-differential signals, a special reference voltage is needed. Typically, SA's are optimized for sensing very small signals at the expense of additional delay. Additionally, both the SA and the reference voltage generator may contain many transistors which may require a large circuit area.

FIG. 1 shows a typical circuit 100 used to provide level translation. The circuit 100 comprises NFETs 102, 104 and 106. The circuit 100 also comprises cross-coupled PFETs 108 and 110, and PFET 112. A serial connection is formed where the drain of the NFET 102 is coupled to the drain of the PFET 108. The upper NFET 102 source and the lower NFET 104 drain are connected to the drain of the additional PFET 112. The gate of the PFET 112 is connected to the gates of the NFET 102 and 104, and to an input 114. A reduced supply voltage (Vdd1) is fed to the source of this additional PFET 112. The FETs 102, 104, 106 and 112 have small threshold voltages (0.2 * Vdd1) while the FETs 108 and 110 have large threshold voltages (0.2 * Vdd2), where Vdd2 is larger that Vdd1. while the FETs 108 and 110 have large threshold voltages (0.2 * Vdd2), where Vdd2 is larger that Vdd1.

The circuit 100 has significant problems regarding switching speed. In the quiescent state (where the output equals zero), the PFET 108 is opened and the gate of PFET 110 is charged to Vdd2. To switch on the PFET 110, the capacitance of node 116 should be discharged to ground. Since the discharge current is the difference between the current through the NFET 102 and the current through the PFET 108, the PFET 110 will hardly turn on, thereby resulting in a large turn on delay. Similarly, when the NFET 106 turns on, part of its drain current passes through PFET 110 instead of the output load (since the capacitance of the PFET 110 gate should be charged by the PFET 108 turned on by the NFET 106) which then leads to a large turn off delay. This situation is typical for cases where the input and output stages have different power supplies.

The second drawback of the circuit 100 is that there are significant crowbar currents: through FETs 108, 102, and 104 during the switching on transition and through FETs 110 and 106 during switching off transition, thus wasting power. In addition, the small threshold of the NFET 106 contributes to a large leakage current in the off state thus increasing standby power.

SUMMARY OF THE INVENTION

A fully static level translation circuit having a standby power close to zero is provided by embodiments of the present invention. The circuit is controlled by small input voltage pulses (Vin<1V) and produces high output voltage pulses. In order to minimize switch-on time a self-reset circuit is included. The circuit may be used as a "word line" driver in RAM memories with two supply voltages, and in other applications where high speed pulse drivers are necessary.

In one embodiment of the present invention, a level translation circuit is provided for translating the voltage level of an input signal having a first voltage level to form an output signal having a second voltage level. The translation circuit comprises an input stage having logic to receive the input signal having the first voltage level and to create a first stage output signal, an output stage having logic to receive the first stage output signal and produce the output signal having the second voltage level, and a reset stage having logic to receive the first stage output signal and the output signal and to produce a reset stage output signal that is coupled to the output stage.

DESCRIPTION OF THE SPECIFIC EMBODIMENTS

The present invention provides a level translation circuit for use with low voltage CMOS devices.

Figure 1:
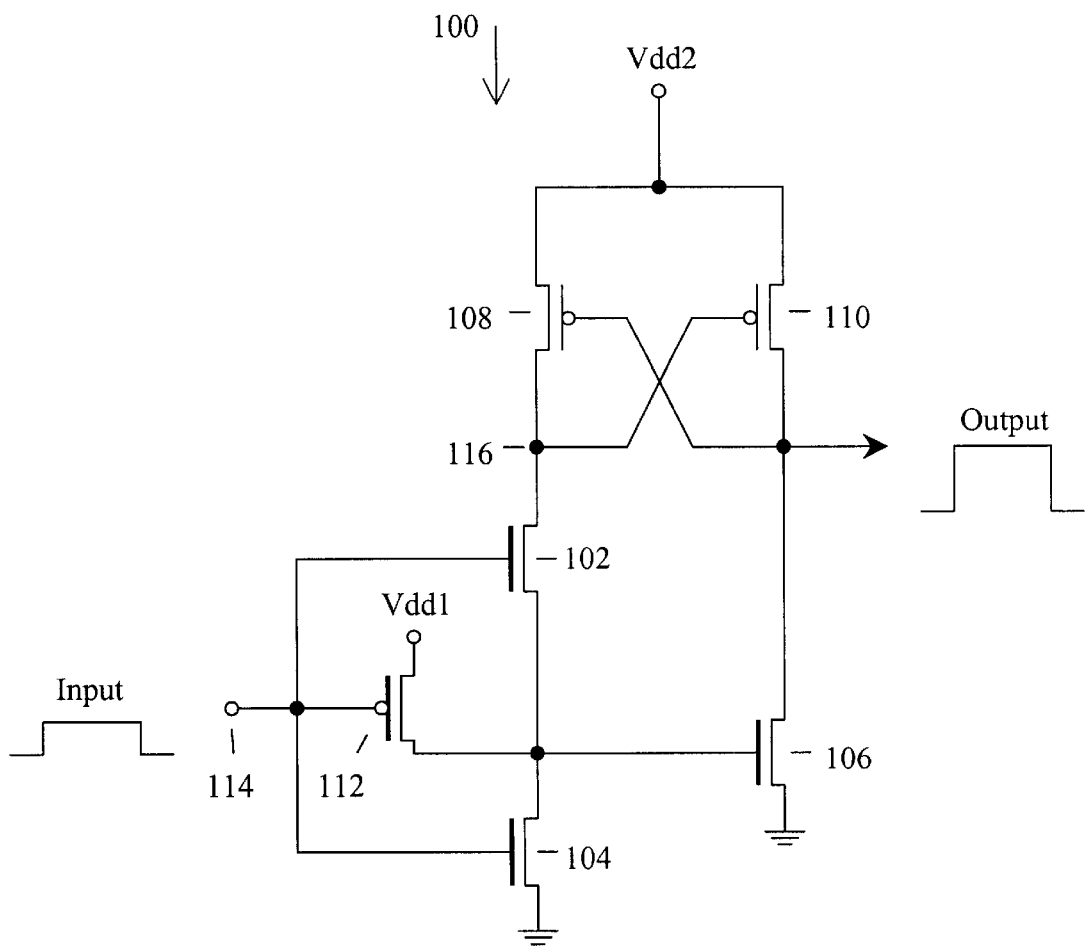
FIG. 1 shows a typical level translation device.
Figure 2:
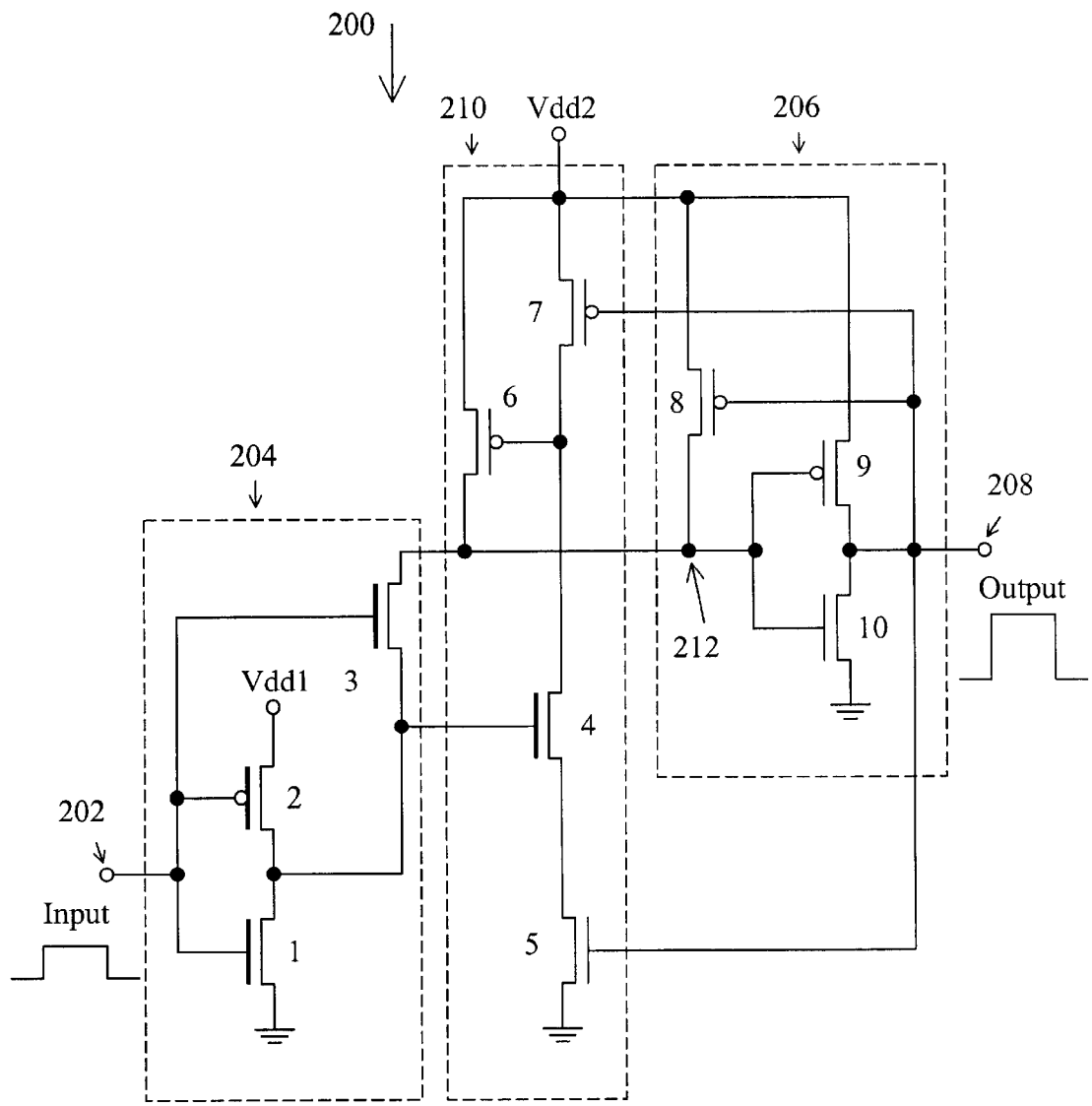
FIG. 2 shows a level translation circuit constructed in accordance with the present invention.

FIG. 2 shows a level translation circuit 200 constructed in accordance with the present invention. The circuit 200 includes an input 202 coupled to an input stage 204. The input stage 204 is coupled to an "output inverter" stage 206. The output inverter stage has an output 208. The output stage 206 is also coupled to a reset stage 210. The circuit 200 uses two different supply voltages shown as Vdd1 and Vdd2. The supply voltage Vdd1 is set to a level equal to the high level of a signal input at input 202. The supply voltage Vdd2 is used to determine the high level of output voltage at the output 204.

The input stage 204 is comprised of transistors 1, 2, and 3. The output stage 206 is comprised of transistors 8, 9 and 10. The reset stage is comprised of transistors 4, 5, 6 and 7. The transistors 1–10 have different voltage thresholds that may be used to increase the speed of the circuit. The thresholds of the transistors 1, 2, 3, and 4 are in the approximate range of (0.1 * Vdd1) to (0.2 * Vdd1). The voltage thresholds of the transistors 5, 6, 7, 8, 9, and 10 are in the approximate range of (0.1 * Vdd2) to (0.2 * Vdd2).

During operation of the circuit, an input signal having a low level is input at input 202 and turns on transistor 2. If there is a high level at the output of the circuit, then the transistors 4 and 5 are conducting and provide a low level at the gate of transistor 6, which in turn passes the Vdd2 supply voltage to the input of the output stage, as shown at 212. The conducting FET 10 provides a low level at the output 208 so that the low level at the input 202 has produced a low level at the output 208.

The low level at the output 208 turns off the transistor 5. The weak transistor 8 provides the cutoff state of the transistor 9 and improves the noise margin.

Note that when low level is transferred from the input 202, the gate of transistor 6 is pulled down at first. After the high-to-low switching of the output 204, the gate potential of transistor 6 is "reset" to high level by the turning on of transistor 7 and the turning off of the transistor 5. This disconnects the transistor 6 from the output stage 206 and reduces the delay of the device when a high level is provided at the input 202.

When the input signal at the input 202 provides a high input level, FET transistors 1 and 3 turn on, which provide a low level at the input of the output stage 206 and turns off FET transistor 4. The transistor 9 switches on and provides Vdd2 at the output 204. The distinctive features of the device are high speed and very small active and standby power (on both levels of the output) since there are no crowbar currents (except for the input and output inverters typically used for CMOS devices). The FETs 5, 6, 9 and 10 have relatively large threshold voltages and consequently, small leakage currents when there is zero volts between their source and gate terminals. Although the transistor FET 3 has a small threshold, in standby mode there is the reverse bias between the gate and source equal to Vdd1 therefore the leakage current of this transistor is small.

The present invention provides an apparatus for level translation for use with CMOS circuitry. It will be apparent to those with skill in the art that modifications to the above methods and embodiments can occur without deviating from the scope of the present invention. Accordingly, the disclosures and descriptions herein are intended to be illustrative, but not limiting, of the scope of the invention which is set forth in the following claims.

What is claimed is:

1. A level translation circuit for translating the voltage level of an input signal having a first voltage level to form an output signal having a second voltage level, the translation circuit comprising:

an input stage (204) having logic to receive the input signal having the first voltage level and to create a first input stage output signal and a second input stage output signal;

an output stage (206) having logic to receive the first input stage output signal and a reset stage output signal to produce the output signal having the second voltage level; and a reset stage (210) having logic to receive the first input stage output signal, the second input stage output signal and the output signal, and wherein said reset stage includes logic to produce the reset stage output signal that is coupled to the output stage.

2. A level translation circuit for translating the voltage level of an input signal having a first voltage level to form an output signal having a second voltage level, the translation circuit comprising:

an input stage (204) having logic to receive the input signal having the first voltage level and to create a first input stage output signal and a second input stage output signal;

an output stage (206) having logic to receive the first input stage output signal and a reset stage output signal to produce the output signal having the second voltage level; and a reset stage (210) having logic to receive the first input stage output signal, the second input stage output signal and the output signal, and wherein said reset stage includes logic to produce the reset stage output signal that is coupled to the output stage, and wherein the input stage includes an inverter that receives the input signal and produces the second input stage output signal that is coupled to the reset stage.

3. A level translation circuit for translating the voltage level of an input signal having a first voltage level to form an output signal having a second voltage level, the translation circuit comprising:

an input stage (204) having logic to receive the input signal having the first voltage level and to create a first input stage output signal and a second input stage output signal;

an output stage (206) having logic to receive the first input stage output signal and a reset stage output signal to produce the output signal having the second voltage level; and a reset stage (210) having logic to receive the first input stage output signal, the second input stage output signal and the output signal, and wherein said reset stage includes logic to produce the reset stage output signal that is coupled to the output stage, and wherein the reset stage includes a first transistor and a second transistor having a first gate terminal and a second gate terminal, respectively, coupled to the output signal.

4. A level translation circuit for translating the voltage level of an input signal having a first voltage level to form an output signal having a second voltage level, the translation circuit comprising:

an input stage (204) having logic to receive the input signal having the first voltage level and to create a first input stage output signal and a second input stage output signal;

an output stage (206) having logic to receive the first input stage output signal and a reset stage output signal to produce the output signal having the second voltage level; and a reset stage (210) having logic to receive the first input stage output signal, the second input stage output signal and the output signal, and wherein said reset stage includes logic to produce the reset stage output signal that is coupled to the output stage, and wherein the output stage includes an inverter that receives the first input stage output signal and produces the output signal.

* * * * *